(12) United States Patent
Jung et al.

(10) Patent No.: US 7,495,973 B2
(45) Date of Patent: Feb. 24, 2009

(54) CIRCUIT AND METHOD FOR CONTROLLING WRITE RECOVERY TIME IN SEMICONDUCTOR MEMORY DEVICE

(75) Inventors: Han-Gyun Jung, Seoul (KR); Seung-Bum Ko, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 228 days.

(21) Appl. No.: 11/625,597

(22) Filed: Jan. 22, 2007

(65) Prior Publication Data

US 2007/0171763 A1 Jul. 26, 2007

(30) Foreign Application Priority Data

Jan. 23, 2006 (KR) .................. 10-2006-0006919

(51) Int. Cl.
*G11C 7/00* (2006.01)
(52) U.S. Cl. ..................... 365/194; 365/233
(58) Field of Classification Search ........... 365/194, 365/233, 203
See application file for complete search history.

(56) References Cited

U.S. PATENT DOCUMENTS

| 6,185,141 | B1* | 2/2001 | Hoshita et al. ............ 365/203 |
| 6,356,494 | B2 | 3/2002 | Jang et al. |
| 6,434,082 | B1 | 8/2002 | Hovis et al. |
| 7,263,013 | B2* | 8/2007 | Kim ........................ 365/203 |
| 2002/0105635 | A1* | 8/2002 | Koshikawa ............... 356/233 |
| 2003/0185075 | A1 | 10/2003 | Park et al. |
| 2005/0099837 | A1 | 5/2005 | Im et al. |

FOREIGN PATENT DOCUMENTS

| JP | 2000-207883 | 7/2000 |
| KR | 2003-0088956 | 11/2003 |
| KR | 2005-0041580 | 5/2005 |
| KR | 10-0503850 | 7/2005 |
| KR | 10-0533696 | 11/2005 |

OTHER PUBLICATIONS

English language abstract of Korean Publication No. 2003-0088956, Nov. 21, 2003.
English language abstract of Korean Publication No. 2005-0041580, May 4, 2005.
English language abstract of Korean Publication No. 10-0503850, Jul. 18, 2005.
English language abstract of Korean Publication No. 10-0533696, Nov. 29, 2005.
English language abstract of Japanese Publication No. 2000-207883, Jul. 28, 2000.

* cited by examiner

*Primary Examiner*—Vu A Le
(74) *Attorney, Agent, or Firm*—Marger Johnson & McCollom, P.C.

(57) ABSTRACT

A circuit and a method for controlling a write recovery time (tWR) in a semiconductor memory device are disclosed. The method according to one embodiment of the present invention includes receiving an automatic precharge write command, and generating a tWR control signal, which is delayed from a point in time when the automatic precharge write command is received to a point in time when a last data segment is written in the semiconductor memory device. Therefore, power consumption and clock noise may be reduced since an operation of a counter in the circuit for controlling the tWR may be minimized after a point in time when the last data is written.

12 Claims, 6 Drawing Sheets

CIRCUIT AND METHOD FOR CONTROLLING WRITE RECOVERY TIME IN SEMICONDUCTOR MEMORY DEVICE

CROSS-REFERENCE TO RELATED APPLICATIONS

This application claims priority under 35 USC § 119 to Korean Patent Application No. 2006-6919, filed on Jan. 23, 2006 in the Korean Intellectual Property Office (KIPO), the contents of which are herein incorporated by reference in their entirety.

BACKGROUND

1. Field of the Invention

The present invention relates to a circuit and a method for controlling a write recovery time in a semiconductor memory device, and more particularly to a circuit and a method capable of reducing current consumption and noise that are generated during a write recovery time.

2. Description of the Related Art

In synchronous semiconductor memory devices, such as synchronous dynamic random-access memory (SDRAM), double data rate (DDR) SDRAM, DDR2 SDRAM, DDR3 SDRAM, etc., an automatic precharge write operation mode is performed so as to achieve high speed operation. In order to precharge a bit line so as to perform a following command after a write operation, the automatic precharge write operation mode does not receive a new precharge command from the exterior of the device, but automatically generates a precharge command inside of the device when a write command is inputted.

Since a precharge operation needs to be performed after write data is stably written in a memory cell, a minimal write recovery time (tWR) needs to be guaranteed from a point in time when the last data is written to a point in time when the precharge operation begins.

In Korean Patent No. 503850 (U.S. Pat. No. 6,434,082), a technology including a programming mechanism for setting a tWR as a function of an input clock is disclosed. In Korean Patent No. 533696, a technology capable of sufficiently providing a voltage for the last write data of a memory cell array during a tWR is disclosed. In Korean Patent Laid-Open Publication No. 2005-41580 (U.S. 2005-0099837), a technology for controlling an automatic precharge timing in response to a column address strobe (CAS) latency control signal, so as to control a tWR according to a frequency of an operation clock, is disclosed.

In order to control a tWR, a control signal for the tWR is generated, and a clock is counted in response to the control signal for the tWR to calculate a point in time when the precharge operation begins, wherein the control signal for the tWR is activated from a point in time when a write command is inputted and deactivated at a point in time when an automatic precharge operation is performed.

Therefore, the counting operation is performed for an unnecessarily long time, and a lot of switching current is consumed in a clock toggle operation by the counting operation. In addition, a high-speed switching operation may be a source of noise.

SUMMARY

Accordingly, the present invention is provided to substantially obviate one or more problems due to limitations and disadvantages of the related art.

Example embodiments of the present invention may provide a circuit and a method for controlling a write recovery time (tWR) in a semiconductor memory device, which is capable of reducing current consumption and noise by properly reducing a time for activating a control signal for the tWR to minimize the time required for a clock toggle operation.

In some example embodiments of the present invention, a method for controlling a tWR in a semiconductor memory device may include receiving an automatic precharge write command, and generating a tWR control signal, which is delayed from a point in time when the automatic precharge write command is received to a point in time when a last data segment is written in the semiconductor memory device.

DETAILED DESCRIPTION

Figure 1:
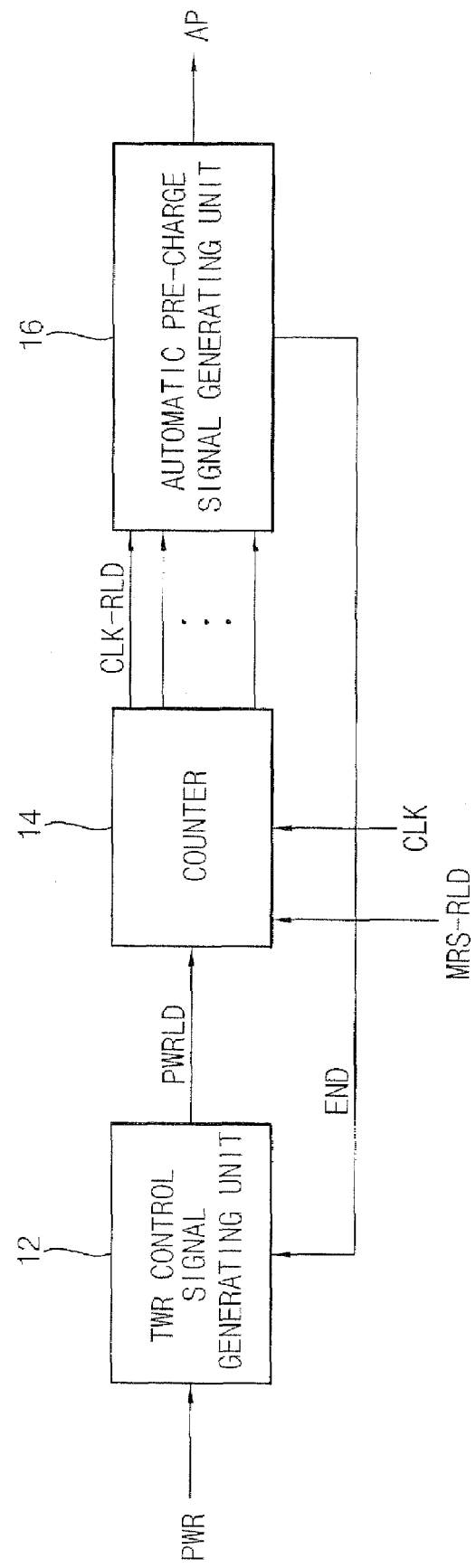
FIG. 1 is a block diagram illustrating a circuit for controlling a write recovery time (tWR).

Embodiments of the present invention will now be described more fully with reference to the accompanying drawings, in which embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an"

and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A write recovery time (tWR) in synchronous dynamic random-access memory (SDRAM) is the time between the point when the last data bit is written in an automatic precharge operation and the point when a precharge operation may begin in the SDRAM. A memory controller determines the point in time when the precharge operation begins, with respect to a manual precharge in the SDRAM. Since the controller may simply stand by for a proper time before the manual precharge operation is performed, the tWR may be satisfactory even in a case of the manual precharge.

However, in an automatic precharge operation mode, the tWR needs to be designated inside of the SDRAM as a time period that needs to be matched by the memory controller so as to guarantee proper device operation.

Since the SDRAM may not accurately calculate a delay for a write recovery caused by voltage and temperature variations of an internal non-synchronous timer and process changes, it is difficult for the precharge operation to begin at a proper time without making unnecessary delays.

Figure 2:
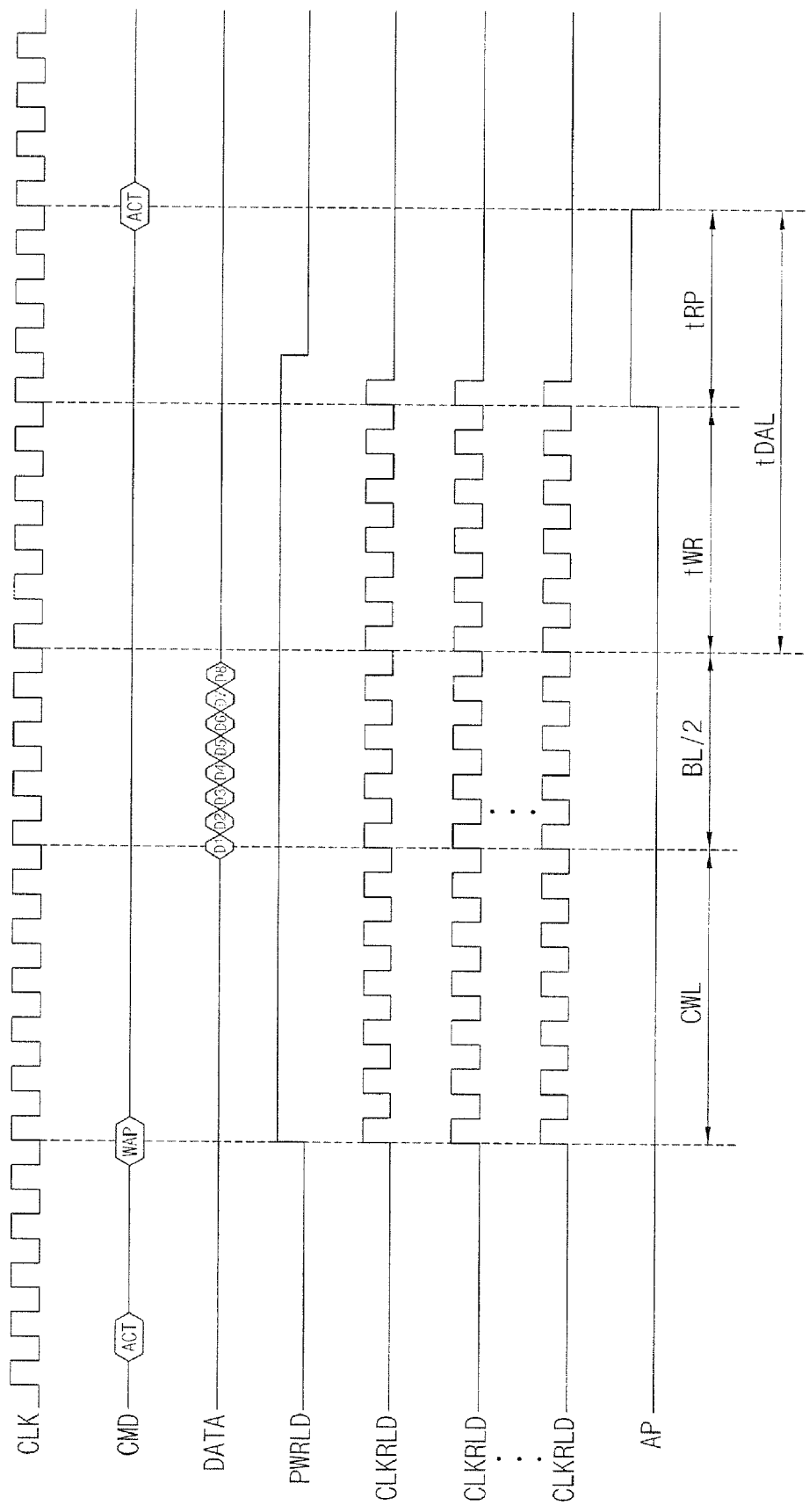
FIG. 2 is a timing diagram for the respective units in FIG. 1.

FIG. 1 is a block diagram illustrating a conventional circuit for controlling a tWR, and FIG. 2 is a timing diagram for the respective units in FIG. 1.

Referring to FIGS. 1 and 2, a circuit 10 for controlling a tWR includes a tWR control signal generating unit 12, a counter 14, and an automatic precharge signal generating unit 16.

The tWR control signal generating unit 12 generates a tWR control signal PWRLD that is activated to a high level in response to a write command signal PWR. The write command signal PWR is provided from a command decoder (not illustrated). The write command PWR may be used interchangeably with the term automatic precharge write command. The counter 14 is enabled by a high state of the tWR control signal PWRLD, and counts a clock signal CLK to output a plurality of count signals CLK-RLD. The automatic precharge signal generating unit 16 generates an automatic precharge signal AP at a timing that is set by a combination of the count signals CLK-RLD. The automatic precharge signal AP is applied to a circuit for bit-line equalizing and precharging. In addition, an end signal END is provided to the tWR control signal generating unit 12 in response to the automatic precharge signal AP. Thus, the tWR control signal generating unit 12 deactivates the tWR control signal PWRLD to a low state in response to the generation of the automatic precharge signal AP, and consequently the counter 14 stops a count operation.

As described above, the counter is configured to be enabled by the tWR control signal PWRLD that is synchronized and activated at a point in time when the write command is inputted, so as to generate the automatic precharge signal AP with respect to the tWR, and thus the time for counting becomes unnecessarily long. Therefore, a clock toggle operation of the count signals CLK-RLD causes unnecessary power consumption and clock noise.

In addition, the above problem may have much more of an influence in DDR3 SDRAM, for example, which has a high frequency. Hence, in a semiconductor memory device requiring high speed operation, electrical designs for reducing power consumption and countermeasures against noise are becoming increasingly required as clock frequencies become higher.

According to an example embodiment of the present invention, a delay time of a write latency and a delay time corresponding to a burst length are in a deactivated state, and may be accurately checked to verify if the delay time is within an activated interval of the tWR control signal. Thus the activated interval may be drastically narrowed overall so that an operation time of the counter may be minimized.

Figure 3:
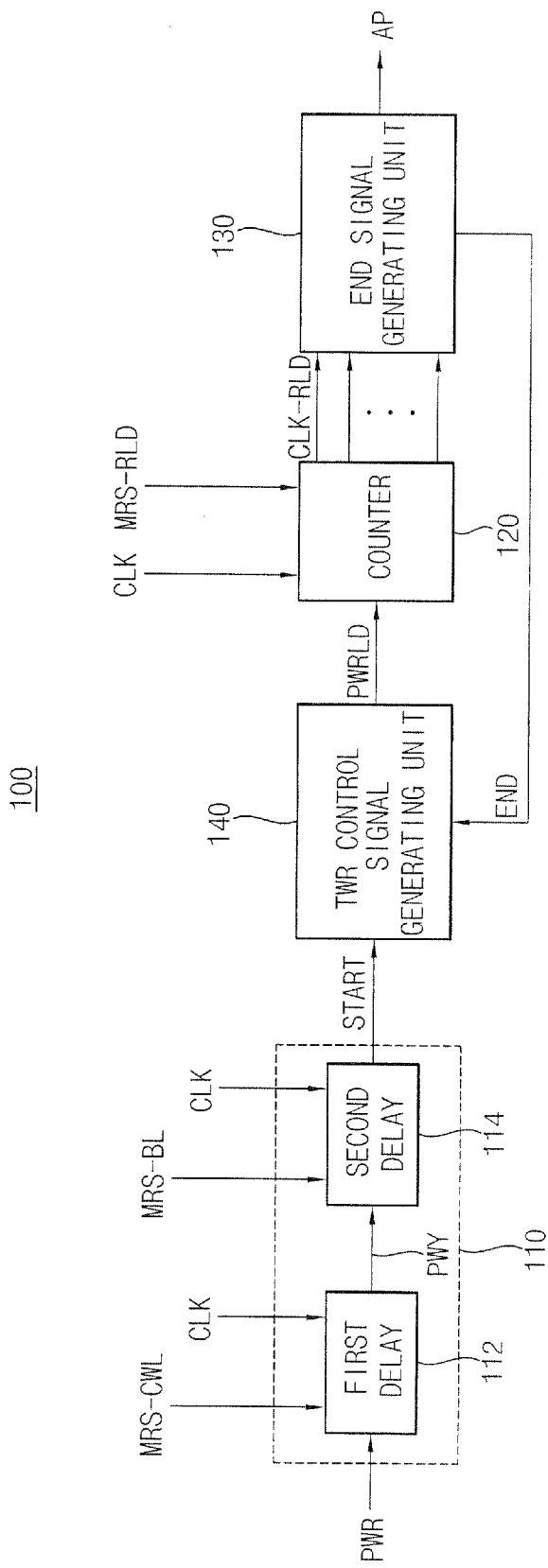
FIG. 3 is a block diagram illustrating a circuit for controlling a tWR according to an example embodiment of the present invention.

FIG. 3 is a block diagram illustrating a circuit for controlling a tWR according to an example embodiment of the present invention.

Referring to FIG. 3, the circuit 100 for controlling a tWR includes a start signal generating unit 110, a counter 120, an end signal generating unit 130, and a tWR control signal generating unit 140.

In order to delay an automatic precharge write command from a point in time when the automatic precharge write command is inputted and generate a tWR start signal START corresponding to a point in time when the last data is written, the start signal generating unit 110 includes a first delay unit 112 and a second delay unit 114. The start signal START may also be referred to as a second delay signal.

The first delay unit 112 delays an automatic precharge write command signal by the number of delay clocks of a CAS write latency (CWL) to generate a first delay signal PWY. The CAS write latency (CWL) is a time delay from a point in time when a write command is inputted to a point in time when a column select line is selected and data is sensed by a bit-line sense amplifier. The CWL is generally determined as the number of clocks (CWL=CL−1); that is, one clock subtracted from the number of clocks of a column latency (CL). The CWL is determined to be about 2 to 3 clocks in DDR SDRAM, about 3 to 5 clocks in DDR2 SDRAM, and about 5 to 9 clocks in DDR3 SDRAM. The CWL is set in advance to a predetermined number of clocks by a mode register set command.

Figure 4:
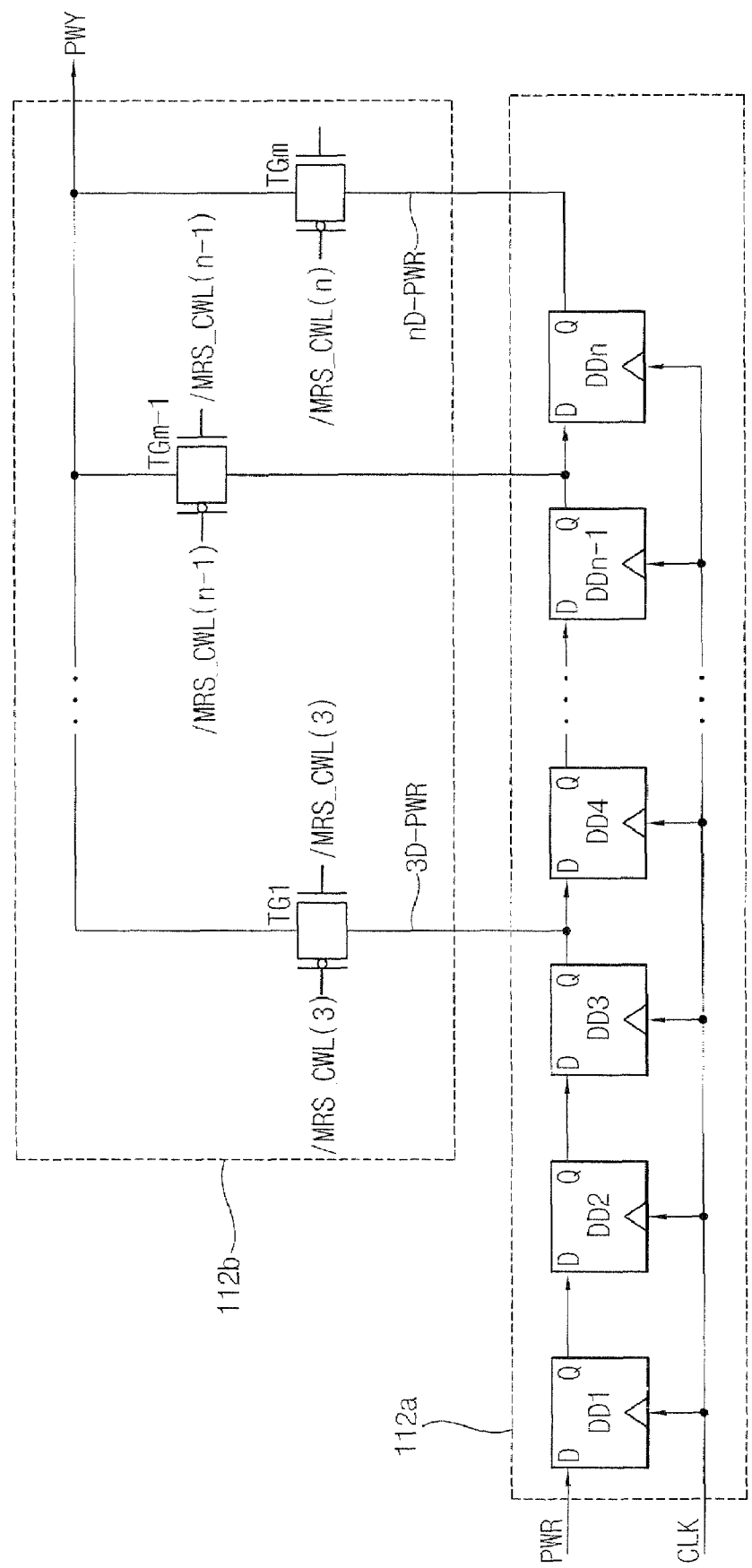
FIG. 4 is a circuit diagram illustrating the first delay unit in FIG. 3 according to an example embodiment of the present invention.

FIG. 4 is a circuit diagram illustrating the first delay unit in FIG. 3 according to an example embodiment of the present invention.

Referring to FIG. 4, the first delay unit 112 includes a plurality of D flip-flops (DD1 through DDn) and a plurality of transfer gates (TG1 through TGm). The D flip-flops constitute a delay unit of n stages having a cascade configuration of input and output stages, i.e., a delay circuit unit 112a. A write command signal PWR is applied to an input stage of a first D flip-flop DD1. Since an input signal is outputted in response to an ascending edge of a clock signal CLK, a three-clock delayed signal 3D-PWR is outputted from an output stage of the third D flip-flop DD3. The transfer gates (TG1 through TGm) are configured as a multiplexer 112b, and select one of the signals from output stages of the D flip-flops (DD3 through DDn) in response to a mode register set signal MRS-CWL that specifies a write latency. The selected signal is outputted as a first delay signal PWY. Thus, the first delay signal PWY is a write command signal that is delayed by a predetermined number of clocks of the write latency. Therefore, delay characteristics of the first delay signal PWY are programmed according to the write latency.

In FIG. 3, the second delay unit 114 delays the first delay signal PWY by the number of clocks corresponding to a burst length (BL) to generate the start signal START. Since data that is to be serially written are written on respective ascending and descending edges of a clock signal, for example, two clocks are required when the number of the data items is 4, and four clocks are required when the number of the data items is 8. Thus, the number of clocks corresponding to a BL is calculated as BL/2. The BL is provided as BL=4 and 8 in DDR2 SDRAM, and BL=4, 8, 16, and 32 in DDR3 SDRAM. The burst length is set in advance to a predetermined burst length by the mode register set command.

Figure 5:
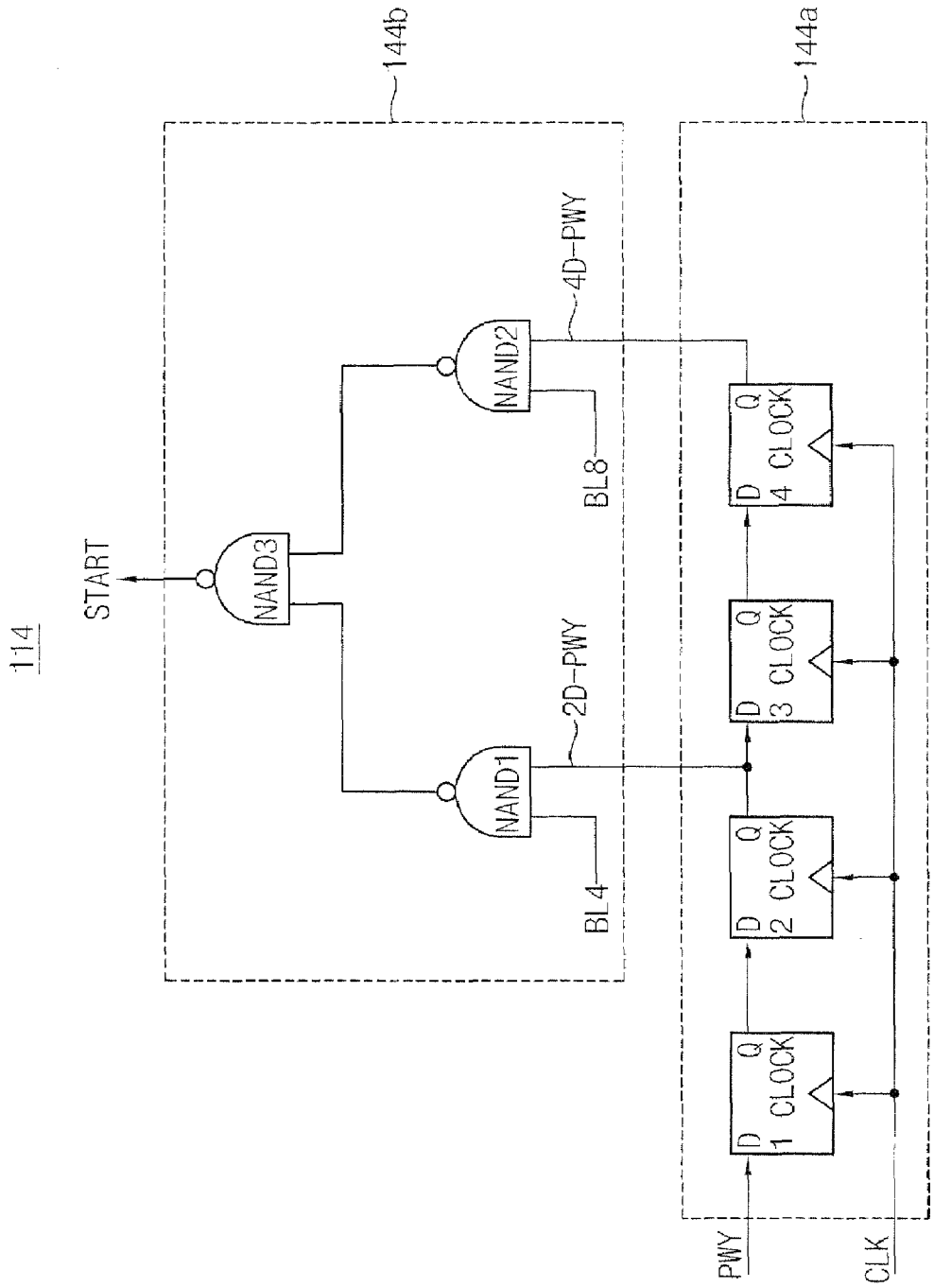
FIG. 5 is a circuit diagram illustrating the second delay unit in FIG. 3 according to an example embodiment of the present invention.

FIG. 5 is a circuit diagram illustrating the second delay unit in FIG. 3 according to an example embodiment of the present invention.

Referring to FIG. 5, the second delay unit 114 includes four D flip-flops (DD1 through DD4) and three NAND gates (NAND1 through NAND3), for example, in DDR2 SDRAM. The four D flip-flops (DD1 through DD4) constitute a delay unit of 4 stages having a cascade configuration of input and output stages, i.e., a delay circuit unit 114a. A first delay signal PWY is applied to an input stage of a first D flip-flop DD1. Since an input signal is outputted in response to an ascending edge of a clock signal CLK, a two-clock delayed signal 2D-PWY is outputted from an output stage of the second D flip-flop DD2, and a four-clock delayed signal 4D-PWY is outputted from an output stage of the fourth D flip-flop DD4.

The NAND gates (NAND1 through NAND3) constitute an output selection circuit 114b. The NAND gate NAND1 gates the two-clock delayed signal 2D-PWY according to a signal BL4, and the NAND gate NAND2 gates the four-clock delayed signal 4D-PWY according to a signal BL8. The NAND gate NAND3 outputs a start signal START of a high state when both outputs of the NAND gates NAND1 and NAND2 are in a low state. Thus, as illustrated in the following logic TABLE 1, when the signal BL4 is selected, the two-clock delayed signal 2D-PWY is selected to be outputted as the start signal START, wherein the two clocks constitute an input time of burst data. In addition, when the signal BL8 is selected, the four-clock delayed signal 4D-PWY is selected to be outputted as the start signal START.

TABLE 1

| BL4 | 2D-PWY | NAND1 | BL8 | 4D-PWY | NAND2 | NAND3 |
|---|---|---|---|---|---|---|
| 0 | 0 | 1 | 1 | 0 | 1 | 0 |
| 1 | 0 | 1 | 0 | 0 | 1 | 0 |
| 0 | 1 | 1 | 1 | 1 | 0 | 1 |
| 1 | 1 | 0 | 0 | 1 | 1 | 1 |

Referring to FIG. 3, the counter 120 is enabled when the tWR control signal PWRLD is in an activated state, i.e., in a high state, and counts a clock signal CLK in response to a mode register set signal MRS-RLD to generate the count signals CLK-RLD. The end signal generating unit 130 generates the automatic precharge signal AP; that is, the end signal generating unit 130 combines the count signals CLK-RLD from the counter 120 to generate the automatic precharge signal AP. An end signal END is generated in response to the automatic precharge signal AP, and provided to the tWR control signal generating unit 140. In response to receiving the end signal END, the tWR control signal generating unit 140 deactivates the tWR control signal PWRLD to a low state.

The tWR control signal generating unit 140 is therefore activated in response to the start signal START and deactivated in response to the end signal END. Thus, the tWR control signal PWRLD is substantially activated only in a tWR, that is, from a point in time when the last data is written to a point in time when the precharge operation begins, and deactivated during an unnecessary interval, i.e., the interval of the write latency and interval of the burst data input.

Figure 6:
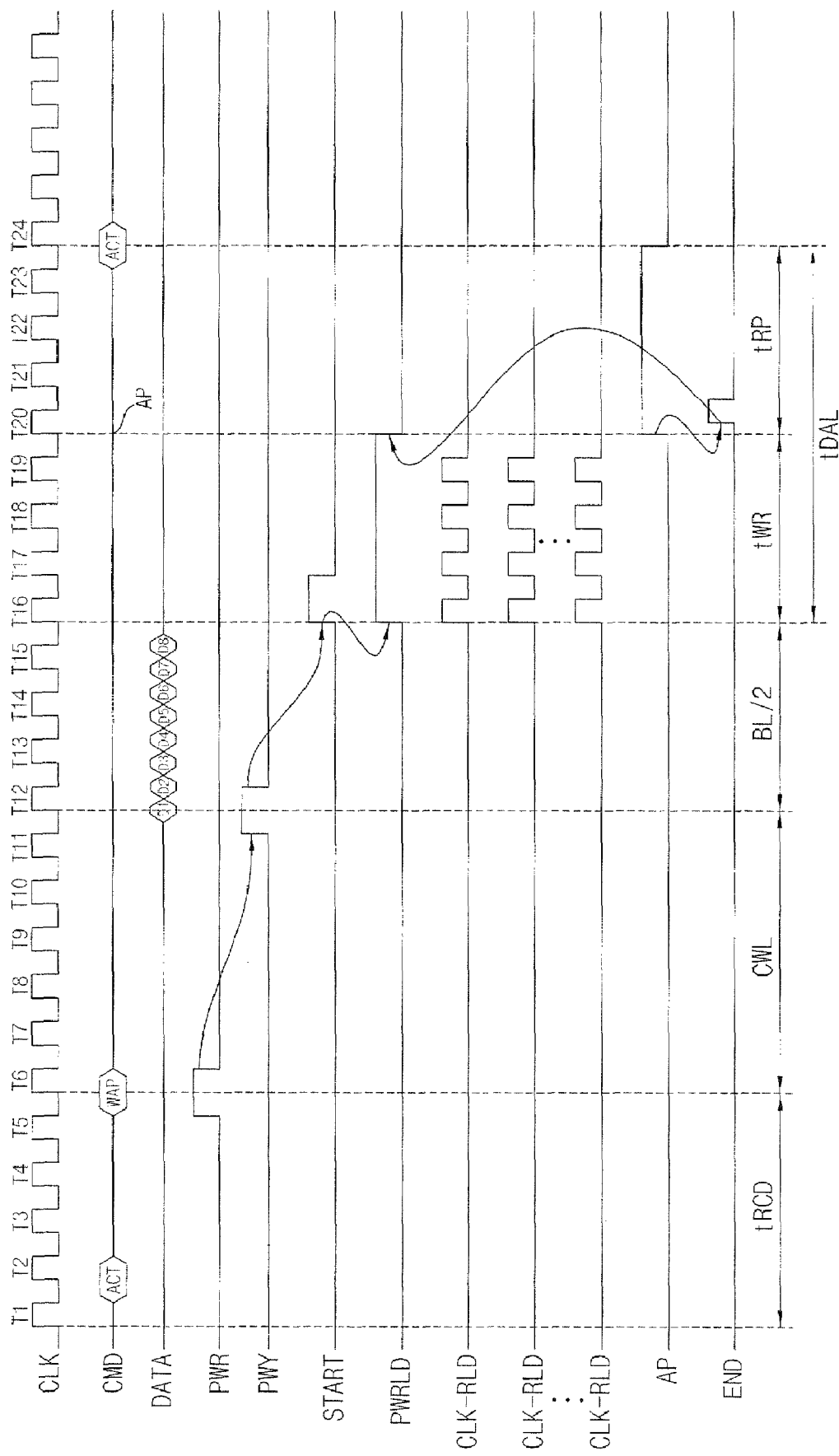
FIG. 6 is a timing diagram for the respective units in FIG. 3 according to an example embodiment of the present invention.

FIG. 6 is a timing diagram for the respective units in FIG. 3 according to an example embodiment of the present invention.

Assuming that the present invention is applied to DDR2 SDRAM (for example, tRCD=5, AL=0, CWL=6, BL=8, tWR=4, tRP=4), an operation of a circuit for controlling a write recovery time according to an example embodiment of the present invention will be described with reference to FIG. 6.

In the DDR2 SDRAM, an active command is decoded at T1, and thus a word line designated by a row address is activated during a row column time delay (tRCD=5). When a write command is decoded at T6, a write command signal PWR is generated and provided to the start signal generating unit 110. The write command signal PWR is delayed by six clock cycles according to the write latency CWL designated by the first delay unit 112, thereby being generated as the first delay signal PWY. When a column line designated by a column address is activated at T12, the first data D1 is transferred to a corresponding bit-line sense amplifier through the activated column line to be written in a corresponding cell. In addition, seven adjacent column lines are serially activated by a column counter and transferred to a corresponding bit-line sense amplifier to be serially written in a corresponding cell.

The first delay signal PWY is provided to the second delay unit 114 to be delayed by four clocks through a designation of burst length BL=8, and then activated as a second delay signal, i.e., a start signal START is activated at T16. The tWR control signal PWRLD is activated to a high state in response to the start signal START.

The counter 120 counts a clock and outputs count signals CLK-RLD in response to the tWR control signal PWRLD. At T20, the end signal generating unit 130, i.e., an automatic precharge signal generating unit, combines the count signals CLK-RLD to generate an automatic precharge signal AP. The automatic precharge signal AP is provided to a precharge circuit to perform a precharging operation. An end signal END is generated in response to the automatic precharge signal AP, and provided to the tWR control signal generating unit 140. In response to receiving the end signal END, the tWR control signal generating unit 140 deactivates the tWR control signal PWRLD to a low state. The end signal END may further be generated during the row precharge time tRP.

Therefore, since the tWR control signal PWRLD is activated only in the tWR, a generating time of the count signals CLK-RLD outputted from the counter 120 is drastically reduced from a relatively long time, i.e., CWL+BL/2+tWR, to a much shorter time, i.e., tWR.

As described above, since an activated interval of a tWR is substantially limited to a recovery time interval, a time for a clock toggle operation may be reduced, and thus unnecessary power consumption and clock noise may be minimized.

Having thus described example embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A method for controlling a write recovery time (tWR) in a semiconductor memory device, the method comprising:
   receiving an automatic precharge write command; and
   generating a tWR control signal, which is delayed from a point in time when the automatic precharge write command is received to a point in time when a last segment of data is written in the semiconductor memory device.

2. The method of claim 1, wherein generating of the tWR control signal comprises:
   generating a first delay signal, which is delayed by the number of delay clocks based on a write latency, in response to the automatic precharge write command;
   generating a second delay signal by delaying the first delay signal by the number of delay clocks based on a burst length; and
   generating the tWR control signal, which is activated in response to the second delay signal.

3. A circuit for controlling a tWR comprising:
   a start signal generating unit configured to receive an automatic precharge write command, delay the automatic precharge write command by a predetermined number of clock cycles, and generate a tWR start signal in response to the delayed automatic precharge write command;
   a tWR control signal generating unit configured to generate a tWR control signal in response to the tWR start signal;
   a counter configured to be activated in response to the tWR control signal to count a clock signal; and
   an end signal generating unit configured to combine output signals from the counter to generate a tWR end signal.

4. The circuit of claim 3, wherein the tWR control signal has an activated interval based on the tWR start signal and the tWR end signal.

5. The circuit of claim 3, wherein the start signal generating unit comprises:
   a first delay unit configured to delay an automatic precharge write command signal by the number of delay clocks of a write latency to generate a first delay signal; and
   a second delay unit configured to delay the first delay signal by the number of clocks corresponding to a burst length to generate the tWR start signal.

6. The circuit of claim 5, wherein the first delay unit comprises:
   a delay circuit unit configured to receive the automatic precharge write command signal and generate a plurality of delay signals, which are serially delayed by one clock cycle; and
   a multiplexer configured to select one corresponding delay signal based on a predetermined write latency among the plurality of delay signals to generate the first delay signal.

7. The circuit of claim 5, wherein the second delay unit comprises:
   a delay circuit unit configured to receive the first delay signal and generate a plurality of delay signals, which are serially delayed by one clock cycle; and
   an output selection circuit configured to select one corresponding delay signal based on a predetermined burst length among the plurality of delay signals to output the tWR start signal.

8. A method for controlling a write recovery time (tWR) in a semiconductor memory device, the method comprising:
   receiving a write command;
   delaying the write command for a predetermined number of clock cycles;
   generating a tWR start signal in response to the delayed write command; and
   activating a tWR control signal in response to the tWR start signal.

9. The method of claim 8, further comprising:
   counting a clock signal for a predetermined number of clock cycles and outputting count signals in response to the activated tWR control signal; and
   combining the count signals to generate an automatic precharge signal.

10. The method of claim 9, further comprising generating a tWR end signal in response to the automatic precharge signal and deactivating the tWR control signal in response to the tWR end signal.

11. The method of claim 10, wherein delaying the write command for a predetermined number of clock cycles comprises delaying the write command for a first predetermined number of clock cycles based on a write latency and delaying the write command for a second predetermined number of clock cycles based on a burst length of data being written to the semiconductor memory device.

12. The method of claim 8, wherein delaying the write command for a predetermined number of clock cycles comprises delaying the write command for a first predetermined number of clock cycles based on a write latency and delaying the write command for a second predetermined number of clock cycles based on a burst length of data being written to the semiconductor memory device.

* * * * *